United States Patent [19]

Berney

[11] 3,902,141

[45] Aug. 26, 1975

[54] QUARTZ OSCILLATOR HAVING VERY LOW POWER CONSUMPTION

[75] Inventor: Jean-Claude Berney, Lausanne, Switzerland

[73] Assignee: Bernard Golay S.A., Lausanne, Switzerland

[22] Filed: June 19, 1974

[21] Appl. No.: 480,876

[30] Foreign Application Priority Data

June 20, 1973 Switzerland ........................ 8933/73

[52] U.S. Cl. ............................ 331/116 R; 58/23 A

[51] Int. Cl.² ............................................ H03B 5/36

[58] Field of Search ........... 331/116 R, 159, 108 D; 58/23 R, 23 A, 23 AC

[56] References Cited

UNITED STATES PATENTS

| | | | |
|---|---|---|---|
| 3,725,822 | 4/1973 | Eaton, Jr. | 331/116 R X |
| 3,803,828 | 4/1974 | Keeler et al. | 331/116 R X |

*Primary Examiner*—Siegfried H. Grimm
*Attorney, Agent, or Firm*—Haseltine, Lake & Waters

[57] ABSTRACT

Quartz oscillator having very low power consumption comprising an amplifier formed by two complementary semi-conductors whose sources, gates and drains are connected in parallel in an alternate arrangement with a power supply, a quartz crystal connected between the drains and the gates, a detection capacitor connected between the gates and the sources and a charge capacitor connected between the sources and the drains. Continuous polarization of the semi-conductors is separately effected by the charge of an integration capacitor connecting their respective gates in such a manner that, when the oscillation amplitude is low, the amplifier operates in class A, the semi-conductors each having a threshold voltage between the drain and gate thereof equal or less than that at which it becomes conductive when the drain-source voltage of the semi-conductor tends towards zero, whereby to modify the charge of the polarization capacitor and thereby the polarization of the amplifier which passes from class A to class B, then to class C when the amplitude of oscillation increases.

3 Claims, 4 Drawing Figures

QUARTZ OSCILLATOR HAVING VERY LOW POWER CONSUMPTION

FIELD OF THE INVENTION

The invention relates to quartz oscillator circuits having very low power consumption.

BACKGROUND

The application of the technique C-MOS (complementary metal oxide semi-conductor) to circuits for quartz watches has permitted the obtention of very low power consumption. A new stage could be reached, notably by the utilization of the technique SOS-MOS (silicon on sapphire). However, the low output of the known quartz oscillators to date does not permit taking full advantage of this technique.

SUMMARY OF THE INVENTION

An object of the invention is to provide a quartz oscillator which overcomes this disadvantage.

This oscillator is of the type comprising an amplifier formed by two complementary semi-conductors (N and P) such as FETs or similar elements whose sources, gates and drains are connected in parallel arrangement, a quartz crystal being connected between the drains and gates, a detection capacitor being connected between the gates and sources and a charge capacitor being connected between the sources and drains, the oscillator being characterized in that the continuous polarizations of the semi-conductor elements forming the amplifier are separately fixed by the charge of an integration capacitor connecting their respective gates in such manner that when the amplitude of oscillation is low, the amplifier operates in class A, said semi-conductor elements each comprising between its drain and gate a semi-conductor material having a threshold voltage equal to or less than that when it becomes conductive when the drain-source voltage of said semi-conductor element of the amplifier tends towards zero, whereby to modify the charge of the polarization capacitor and thereby the polarization of the amplifier which passes from class A to class B, then to class C, when the amplitude of oscillation increases.

Furthermore, it is well known that a polarized amplifier in class C can reach an output close to 100%, whereas an amplifier in class B cannot exceed 68%.

BRIEF DESCRIPTION OF THE DRAWING

The annexed drawing illustrates two embodiments of the invention, given by way of example.

DETAILED DESCRIPTION

Figure 1:
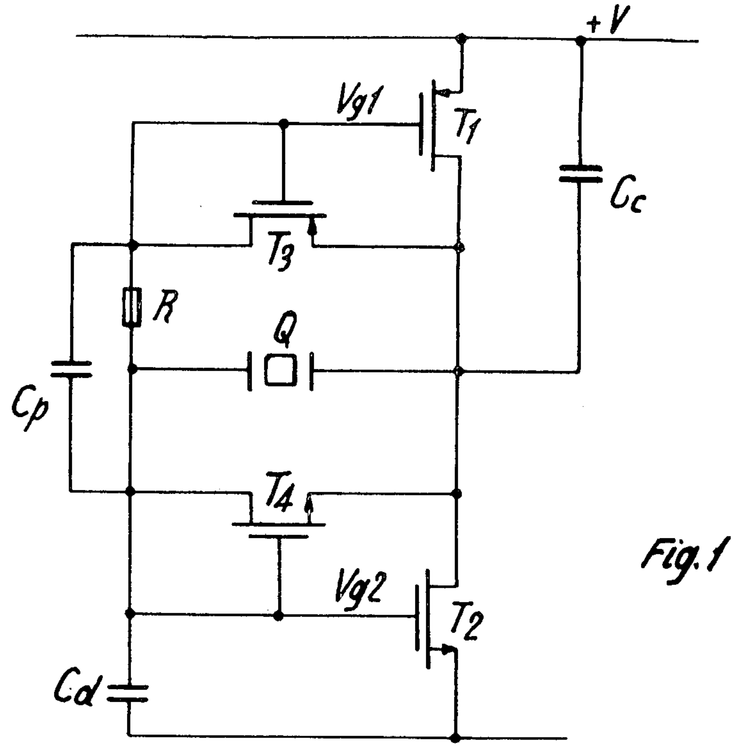
FIG. 1 illustrates a first embodiment.

In FIG. 1, representing the first embodiment, there are seen complementary semi-conductor elements T1 and T2 which may be field effect transistors (FET), or the like, the elements T1 and T2 being connected to form an amplifier. The source of T1 is connected to the positive terminal of the power supply, the source of T2 to the negative terminal of the power supply. The drains of T1 and T2 are connected together, their gates being connected together across a resistance R and a polarization capacitor (integration) *Cp*. A detection capacitor *Cd* is connected between the gate and the source of T2. A quartz crystal Q is connected between the gate and the drain of T2 and a charge capacitor *Cc* is connected between the drain and source of T1.

Figure 2:
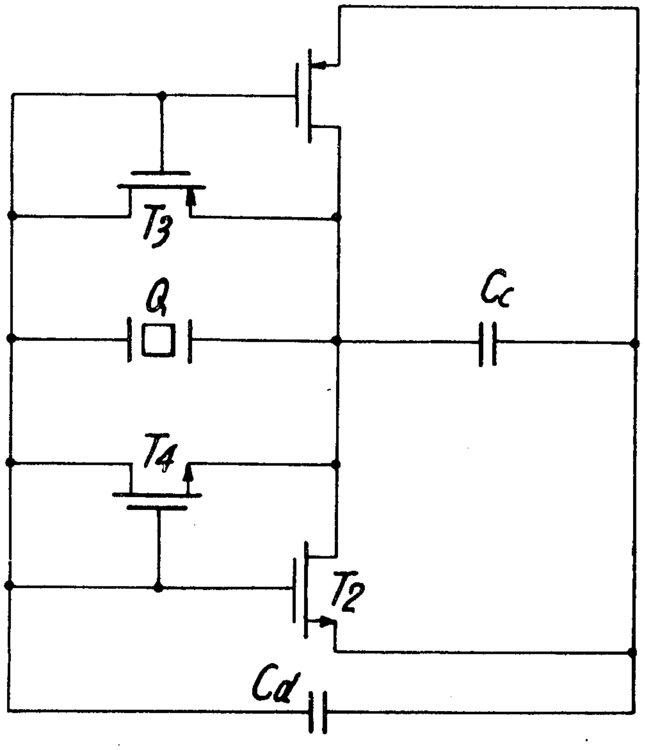
FIG. 2 schematically illustrates an alternative stage of operation of the embodiment of FIG. 1.

If it is considered that in alternative states of operation, the supply and the capacitor *Cp* are short circuits, it is seen in FIG. 2 that the sources, the drains and the gates of T1 and T2 are coupled in parallel two by two, in alternative states, the quartz crystal Q being connected between the drains and the gates, the detection capacitor *Cd* between the gates and the sources and the charge capacitor *Cc*between the sources and the drains. If the semi-conductor elements T3 and T4 are ignored, there remains a well-known electronic oscillator. The novelty of the apparatus resides therefore in the polarization system formed by T3 and T4 and *Cp*. In FIG. 1, we see that T3, which is a semi-conductor element of the same type and the same threshold voltage as T1, has its source connected to the drain of T1, its gate and its drain connected to the gate of T1. Similarly, T4 which is a semi-conductor element of the same type and threshold value as T2 has its source connected to the drain of T2, its gate and its drain connected to the gate of T2. Knowing that T3 and T4 become conductive when their gate-source voltage becomes equal to their threshold voltage, the operation of the circuit can be defined as follows:

Assuming, for purposes of simplifying the explanation that the gains and threshold voltages $V_s$ of T1, T2, T3 and T4 are equal. When the quartz crystal does not oscillate, no current can circulate in T3 and T4, the capacitor *Cp* is completely discharged and the voltages at the terminals of the gates of T1 and T2 are equal and of a value of $V/2$, the voltage at the drains of T1 and T2 is equal to $V/2$.

The amplifier is polarized in class A. If the gain of the oscillator is greater than 1, this causes oscillation. A sinusoidal voltage of maximum amplitude Up is superimposed on the continuous component $V/2$ of the voltage of the drains. When the voltage Up reaches the value Vs, T3 and T4 become alternately conductive while the drain-source voltage of the semi-conductor element of the amplifier to which each of them is connected, tends towards zero. A current thus charges the capacitor *Cp*. If R is very great, the polarization voltages at the gates T1 and T2 will have the following values:

$$Vg1 = \frac{V}{2} + (Up - Vs)$$
$$Vg2 = \frac{V}{2} - (Up - Vs)$$
$$Vg1 = Vg2 = (Up - Vs)$$

When Up increases, the amplifier therefore tends to polarize itself from class A to class B, then to class C. This modification of the polarization produces a diminution in the gain of the amplifier. An equilibrium is established when the gain of oscillation becomes equal to 1. If the gain of oscillation is very high in class A, this state of equilibrium is found when the sinusoidal voltage reaches the value $Up=V/2$. Therefore, in a more perfect polarization in class C, there is assured a very high output of the oscillator and there is obtained a stabilization of the amplitude of oscillation which assures a very good stability in frequency.

By way of example, in a circuit in which the quartz crystal has a frequency of 32,768 Hz, $Cp$=2200 pf, $Cd$=220 pf, $Cc$=22 pf, R=15MΩ there was obtained a power consumption of 0.2 microwatts, this being ten times lower than that obtained with other known oscillators.

Figure 3:
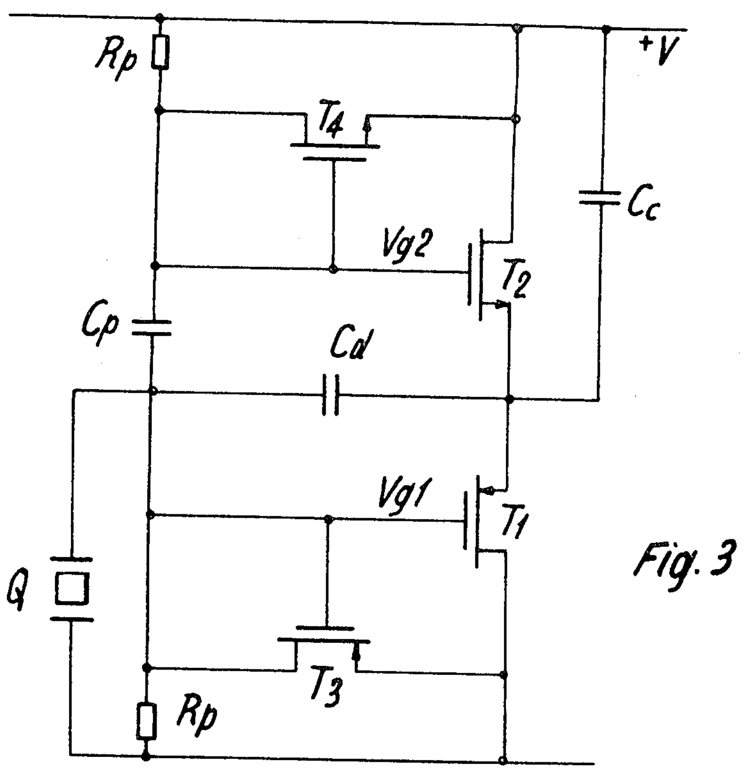
FIG. 3 illustrates a second embodiment, and FIG. 4 schematically illustrates an alternative stage of operation of the embodiment of FIG. 3.

According to the second embodiment of FIG. 3, the sources of T1 and T2 are connected together, whereas the drain of T2 is connected to the positive side of the power supply and the drain of T1 to the negative side.

Figure 4:
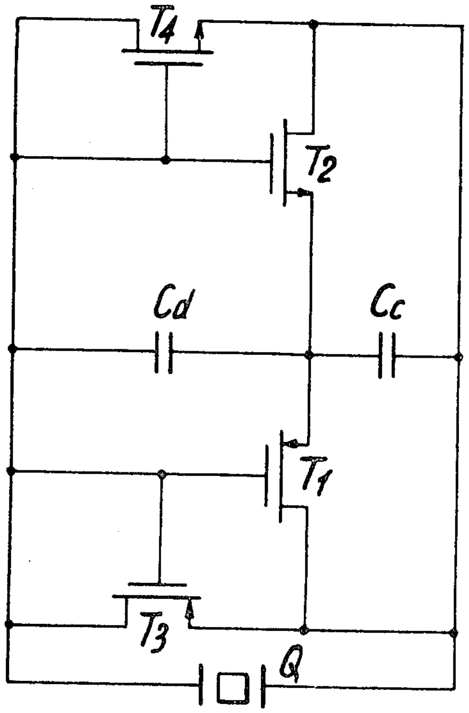

Referring to the alternative schematic equivalent in FIG. 4, there is again exactly the same disposition as in FIG. 2. Only the continuous polarization has changed. In FIG. 3, it is seen that when the quartz crystal doesn't oscillate, the voltage at the gate of T2 is equal to +V and the voltage at the gate of T1 is 0. The voltage at the sources is $V/2$. The amplifier is polarized in class A. When the amplitude of oscillation reaches $Up = Vs$, T3 and T4 become alternately conductive. The polarization capacitor $Cp$, charged at the voltage +V by the large resistances $Rp$, is discharged and $$Vg2 \text{ becomes } +V - (Up - Vs)$$

$$Vg1 \text{ becomes } + (up - Vs)$$

The voltage at the terminals of $Cp$ becomes $V - 2(Up - Vs)$.

The amplifier tends to polarize itself from class A to class B, then to class C. If the gain in class A is raised, the amplitude of oscillation is stabilized around the value $Up = V/2$.

It is quite clear that the semi-conductor elements T3 and T4 can be replaced in certain cases by simple diodes. Additionally, the resistances $Rp$ can be disposed in different manner or even replaced by semi-conductors. The operating principle of the oscillator is nevertheless independent of these different variables and it is considered unnecessary to enumerate them.

What is claimed is:

1. A quartz oscillator having low power consumption comprising an amplifier formed by two complementary semi-conductor elements having sources, gates and drains respectively connected to one another in parallel arrangement with regard to a power supply, a quartz crystal connected between the drains and the gates, a detection capacitor connected between the gates and the sources of the respective semi-conductor elements, a charge capacitor connected between the sources and the drains, and polarization means including an integration capacitor connecting the respective gates of the semi-conductor elements for effecting continuous polarization of the semi-conductor elements by the charge of said integration capacitor such that when the oscillation amplitude is low, the amplifier operates in class A, said semi-conductor elements each having a threshold voltage between its drain and gate which is no greater than that when it becomes conductive when the drain-source voltage of said semi-conductor element tends towards zero, to modify the charge of the polarization capacitor and thereby, the polarization of the amplifier which passes from class A to class B, then to class C when the amplitude of oscillation increases.

2. An oscillator as claimed in claim 1 wherein said polarization means further comprises a pair of additional semi-conductor elements connected in series with the polarization capacitor and in parallel with said quartz crystal, said additional semi-conductor elements being of the same type and threshold value as the corresponding first said semi-conductor elements.

3. An oscillator as claimed in claim 2 wherein said additional semi-conductor elements are connected in parallel with the first said semi-conductor elements which form the amplifier.

* * * * *